United States Patent
Negra et al.

(10) Patent No.: US 9,240,759 B2
(45) Date of Patent: Jan. 19, 2016

(54) AMPLIFIER ASSEMBLY

(71) Applicant: RWTH AACHEN, Aachen (DE)

(72) Inventors: Renato Negra, Aachen (DE); Ahmed Aref, Herzogenrath (DE)

(73) Assignee: RWTH AACHEN (DE)

( * ) Notice: Subject to any disclaimer, the term of this patent is extended or adjusted under 35 U.S.C. 154(b) by 0 days.

(21) Appl. No.: 14/408,517

(22) PCT Filed: Jun. 12, 2013

(86) PCT No.: PCT/EP2013/062105
§ 371 (c)(1),
(2) Date: Dec. 16, 2014

(87) PCT Pub. No.: WO2013/189793
PCT Pub. Date: Dec. 27, 2013

(65) Prior Publication Data
US 2015/0194938 A1 Jul. 9, 2015

(30) Foreign Application Priority Data
Jun. 18, 2012 (DE) .......................... 10 2012 210 249

(51) Int. Cl.
*H03F 1/32* (2006.01)
*H03F 1/02* (2006.01)
(Continued)

(52) U.S. Cl.
CPC ............ *H03F 1/3252* (2013.01); *H03F 1/0288* (2013.01); *H03F 1/0294* (2013.01);
(Continued)

(58) Field of Classification Search
CPC ........ H03F 1/0288; H03F 1/07; H03F 1/3252
USPC ................. 330/295, 124 R, 84, 126
See application file for complete search history.

(56) References Cited

U.S. PATENT DOCUMENTS 5,886,573 A * 3/1999 Kolanek ................ H03F 1/0277
330/10
6,054,894 A * 4/2000 Wright .................. H03F 1/0294
330/124 R
(Continued)

FOREIGN PATENT DOCUMENTS

WO WO2011097387 8/2011

OTHER PUBLICATIONS

Guan et al., "System-level performance study of a multistandard outphasing transmitter using optimized multilevels"; Microwave Symposium Digest (MTT), 2011 IEEE MTT-S International, IEEE, Jun. 5-10, 2011, pp. 1-4, abstract 1 page.
(Continued)

*Primary Examiner* — Henry Choe
(74) *Attorney, Agent, or Firm* — Sheridan Ross P.C.

(57) ABSTRACT

The invention relates to an amplifier assembly. The assembly comprises an input device for receiving a representation of an input signal (I, Q; A, phi), a signal-component separator, wherein the signal-component separator produces a first complex intermediate output signal (S1) and a second complex intermediate output signal (S2), wherein the signal-component separator produces the first complex intermediate output signal (S1) and the second complex intermediate output signal (S2) on the basis of the representation of the input signal (I, Q; A, phi), wherein the signal-component separator provides a plurality of amplitude levels, wherein the plurality of amplitude levels is selected in such a way that a sum of the first complex intermediate output signal (S1) and the second complex intermediate output signal (S2) is substantially a reflection of a complex input signal in accordance with the representation of the input signal (I, Q; A, phi) and the phase angle between the first complex intermediate output signal (S1) and the second complex intermediate output signal (S2) is small. Furthermore, the assembly comprises an amplifying device for amplifying the signals in the high-frequency state and a combining device for combining the signals.

13 Claims, 7 Drawing Sheets

Figure 1:
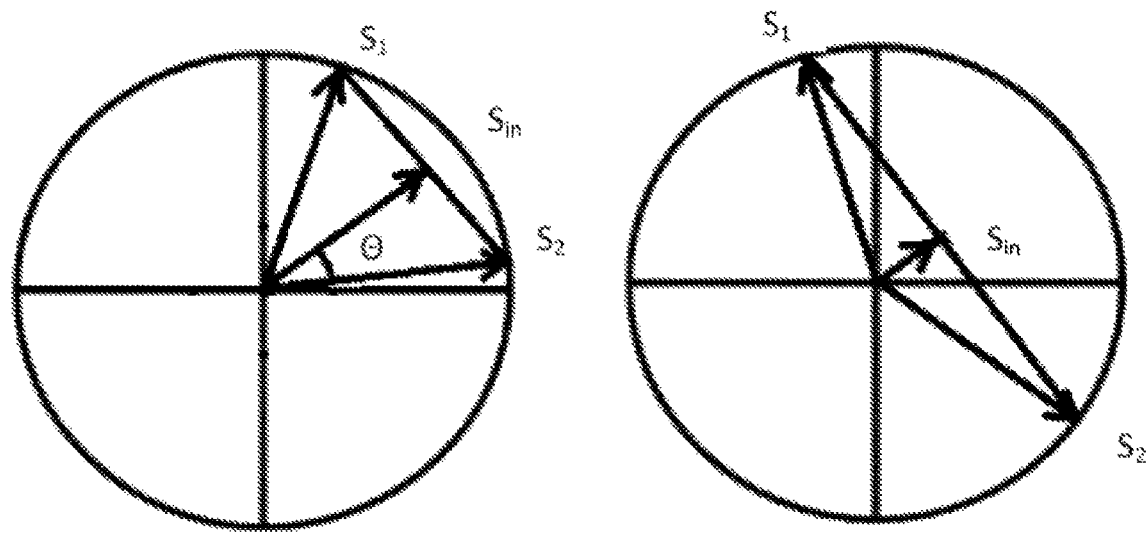

(51) Int. Cl.
*H03F 3/19* (2006.01)
*H03F 3/21* (2006.01)
*H03G 3/30* (2006.01)

(52) U.S. Cl.
CPC ............... *H03F 3/19* (2013.01); *H03F 3/211* (2013.01); *H03G 3/3042* (2013.01); *H03F 2200/36* (2013.01); *H03F 2200/451* (2013.01); *H03F 2201/3215* (2013.01); *H03F 2203/21106* (2013.01)

(56) References Cited

U.S. PATENT DOCUMENTS 8,300,728 B1 * 10/2012 Hoffmann ............... H03C 3/40
330/10

9,106,500 B2 * 8/2015 Sorrells ................ H03F 1/0205
1/1

OTHER PUBLICATIONS

Jheng et al., "Multilevel Linc System Design for Power Efficiency Enhancement," IEEE, SiPS, 2007, pp. 31-34.
International Search Report for International (PCT) Patent Application No. PCT/EP2013/062105 (English Translation), mailed Feb. 12, 2013, 3 pages.
Written Opinion for International (PCT) Patent Application No. PCT/EP2013/062105 (English Translation), mailed Feb. 12, 2013, 16 pages.
International Preliminary Report on Patentability for International (PCT) Patent Application No. PCT/EP2013/062105 (English Translation), mailed Dec. 23, 2014, 17 pages.

* cited by examiner

AMPLIFIER ASSEMBLY

CROSS REFERENCE TO RELATED APPLICATIONS

This application is a national stage application under 35 U.S.C. 371 and claims the benefit of PCT Application No. PCT/EP2013/062105 having an international filing date of Jun. 12, 2013, which designated the United States, which PCT application claimed the benefit of German Patent Application No. 10 2012 210 249.3 filed Jun. 18, 2012, the disclosures of each of which are incorporated herein by reference in their entirety.

The invention concerns an amplifier assembly.

BACKGROUND OF THE INVENTION

In many areas of communications engineering, the linearity of the transmission process is one of the key requirements. In particular, this is of paramount importance in regard to digital transmission systems.

Nonlinearities in transmitters encourage unwanted emissions, which impair the quality of the link of other participants or other transmission services. Furthermore, the nonlinearities cause distortions which have a negative impact on the quality of the link itself.

Thus far, this problem has been dealt with by overdimensioning the high-frequency output stage relative to mean output power. Thus, for example, output power reserves ("back-off") of 10 db or more are not uncommon for ensuring the required linearity.

This overdimensioning of the system has many disadvantages. For one thing, the manufacturing costs are higher. For another, the power efficiency is low, i.e., the efficiency of a transmitter quickly drops with increasing back-off. With decreasing efficiency, the power loss increases. Corresponding cooling systems must be provided in order to dissipate the resulting waste heat.

Thus, for example, cooling systems have to be installed in base stations whose continual operation further worsens the power balance of the base station when the needed cooling power is taken into account. Typical values for the efficiency of modern base stations often lie in the single-digit percent range for this reason.

As a rule, one uses symmetrical or asymmetrical Doherty amplifiers with a corresponding digital predistortion for transmitter architectures in mobile base stations. In this kind of linear transmitting devices, the power amplifier as well as all other subassemblies in the signal path must be designed in regard to a simple predistortion with the most linear possible transmission characteristic.

However, in most cases this is only possible in the upper dynamic ranges at the expense of efficiency. With conventional digitally predistorted Doherty amplifiers for signals with high crest factor, greater efficiency relative to output power stage can be achieved in Class AB operation.

In order to afford the highest possible efficiency, a very complex amplifier model would have to be developed for a real-time implementation of the digital predistortion. This would also have to be able to allow for aging influences and environmental variables. Since this is too complex, the potential of the Doherty concept cannot be fully exploited.

Other concepts, such as the LINC concept (linear amplification with nonlinear components), which is a technique of amplifying amplitude-modulated signals with nonlinear amplifiers, only have low efficiency, or high complexity in the case of multilevel LINC systems.

Due to the use of power supply voltage modulators, the efficiency of the overall design is reduced by the losses of the voltage modulator(s) used. Thus, in order to hold down these losses, only a limited number of voltage levels can be implemented, ideally fixed and predefined ones. In multistandard multiband transmitters, therefore, the required combination of flexibility and high efficiency can only be achieved with difficulty, if at all.

In LINC transmitters, often also called "outphasing transmitters," a complex input signal is converted into two phase-modulated signals with constant envelope curve so that a vector addition of the two signals again yields the original input signal. The two phase-modulated signals thus have the same output level. This principle is shown as a phase diagram in FIG. 1. One can see here that the outphasing angle θ is small for large output powers (example at left), while for very small output signals the outphasing angle θ approaches 180° (example at right).

Figure 2:
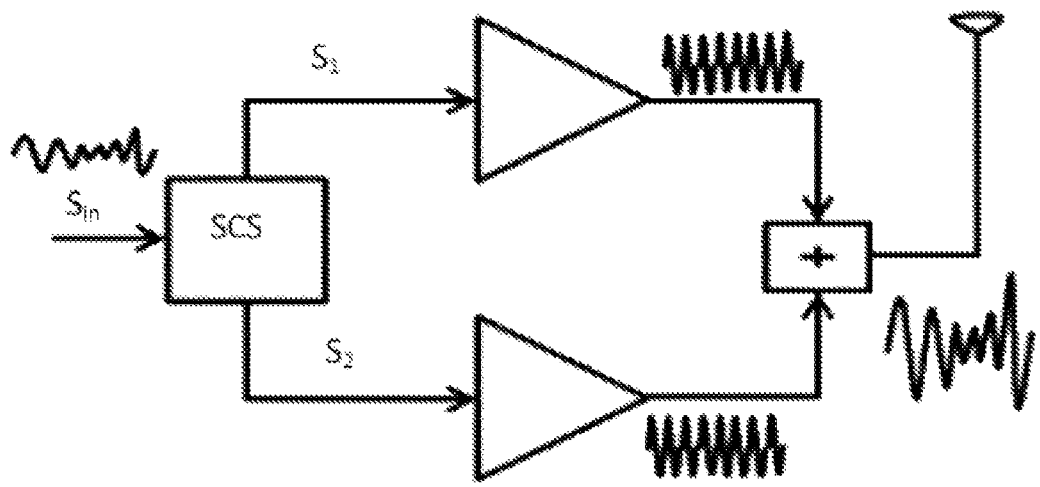

The two phase-modulated signals can now be processed with high-efficiency saturated or switched amplifiers and the high efficiency of these amplifiers can be utilized. The block diagram of a corresponding LINC transmitter from the prior art is shown in FIG. 2. Thus, for peak output power, this amplifier architecture constitutes a very efficient design.

Figure 3:
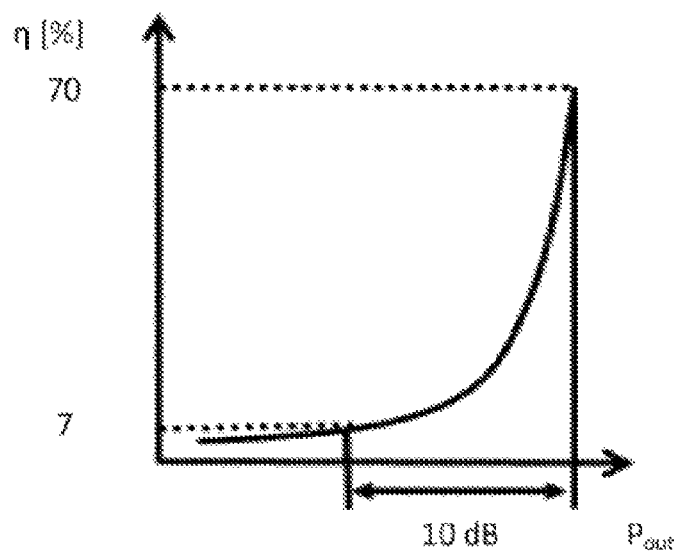

As shown in FIG. 3, however, the efficiency rapidly declines for input signals with increasing crest factor. The energy efficiency of LINC designs decreases considerably more rapidly with increasing back-off than for linear amplifier designs such as power amplifiers in Class A or Class AB operation. This is attributable to the fact that the power combiner at the output synthesizes a signal with lower power from two signals with maximum output power. The excess power is dissipated in the power combiner in this case. This consequently leads to a low system efficiency for low output powers.

While the use of non-isolating combiners can provide an increase in efficiency, this is possible only at the price of less linearity.

Figure 4:
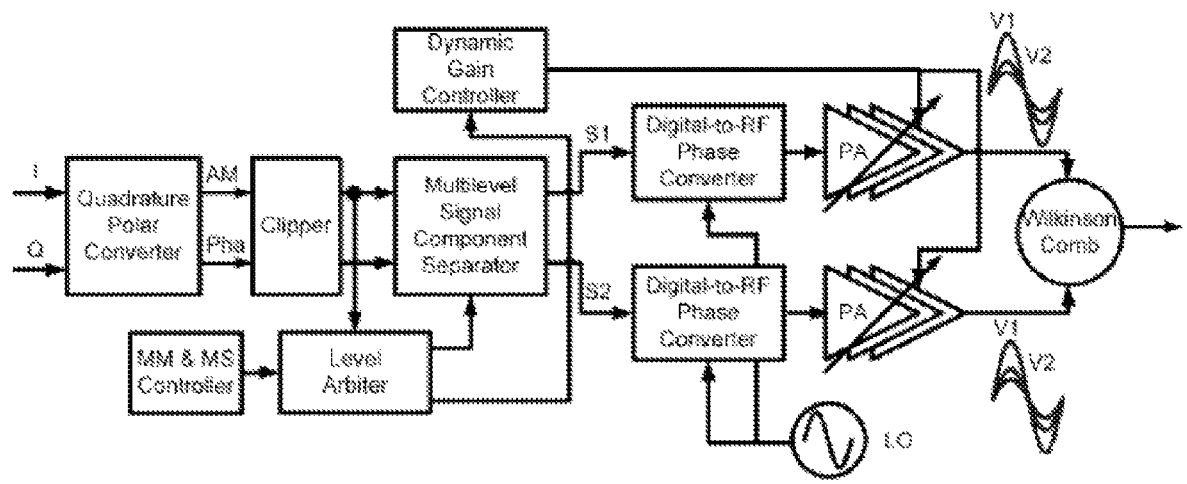

One remedy is afforded by multilevel LINC designs, such as is shown in FIG. 4. Here, additional output levels are introduced for the two amplifiers, in order to keep the outphasing angle as small as possible during the synthesis of output signals with low power, and thereby minimize losses in the power combiner. The principle is shown as an example in a phase diagram in FIG. 5 for a multilevel LINC system with three output levels.

Figure 6:
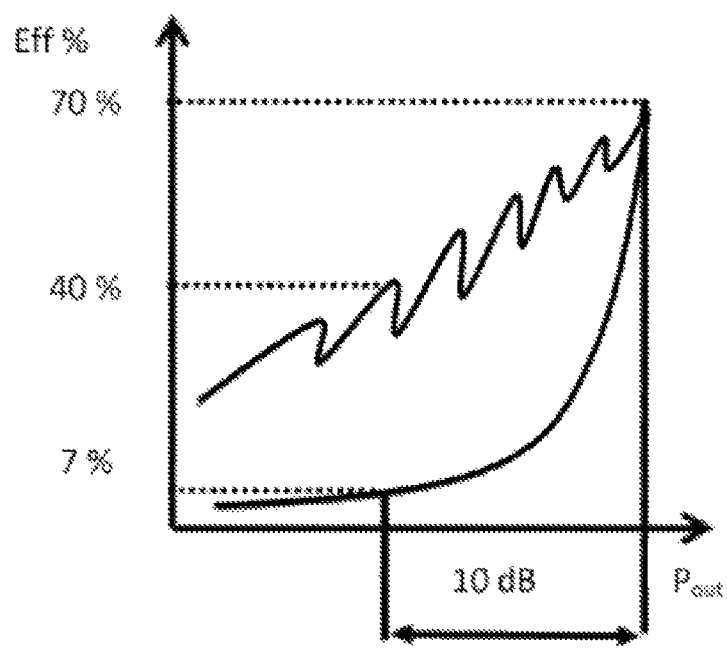

As can be seen from FIG. 6, by adjusting the output power of the output stages in multilevel LINC (ML-LINC) systems, both the overall efficiency and the dynamic range are improved relative to a pure LINC architecture in the amplification of signals with high crest factor.

Different techniques can be used to generate the desired additional output level.

The regulation of the output power in a manner dependent on the input power at any given moment can be achieved, for example, by a rough tracking of the power supply voltage of the saturated output stages with or without regulation of the input power, or by a dynamic scaling of the effective range of the output transistors, or by load modulation. In this process, both paths of the LINC system are scaled at the same time and in the same way, i.e., symmetrical power levels are used, so that the design can be kept very simple.

Alternatively, the use of asymmetrical power levels enables better efficiency, albeit at the cost of higher system complexity.

Nevertheless, the correct temporal coincidence of the output power regulation with the corresponding phase-modulated signal in multilevel LINC systems is of paramount importance for the linearity and quality of the signal. Since different information portions need to be processed in different system pathways, steps must be taken for the two information portions to be simultaneously reunited at the output in order to minimize signal distortions, which may lead to unwanted emissions, among other things.

Based on this situation, the object of the invention is to provide a new amplifier assembly which enables high efficiency along with low complexity. Furthermore, one object of the invention is to provide a new amplifier assembly which makes it possible to reconfigure linearity and energy efficiency individually even for different kinds of modulation.

The object is achieved by an amplifier assembly according to claim 1. Further advantageous features are the subject matter of the dependent claims in particular.

Figure 5:
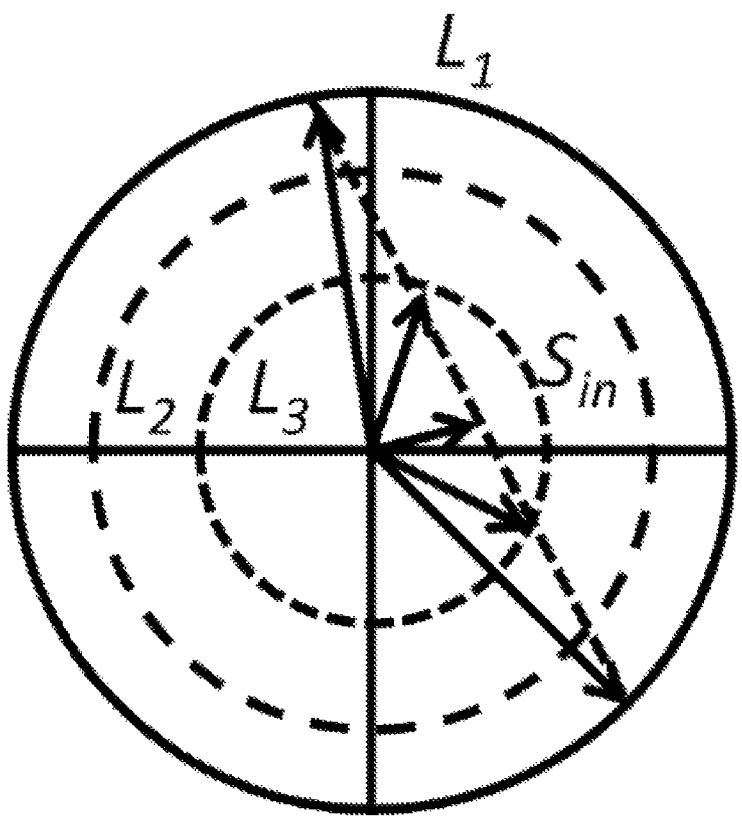

The invention shall be explained more closely below, with reference to the figures. These show:

FIG. 1, a schematic representation of a phasor diagram,

FIG. 2, a schematic block diagram of an LINC transmitter according to the prior art, FIG. 3, a schematic representation of the efficiency of an LINC design according to the prior art as a function of the system output power, FIG. 4, a schematic block diagram of a multilevel LINC transmitter according to one embodiment of the invention, FIG. 5, a schematic representation of a phasor diagram of a multilevel LINC transmitter according to the prior art.

Figure 7:
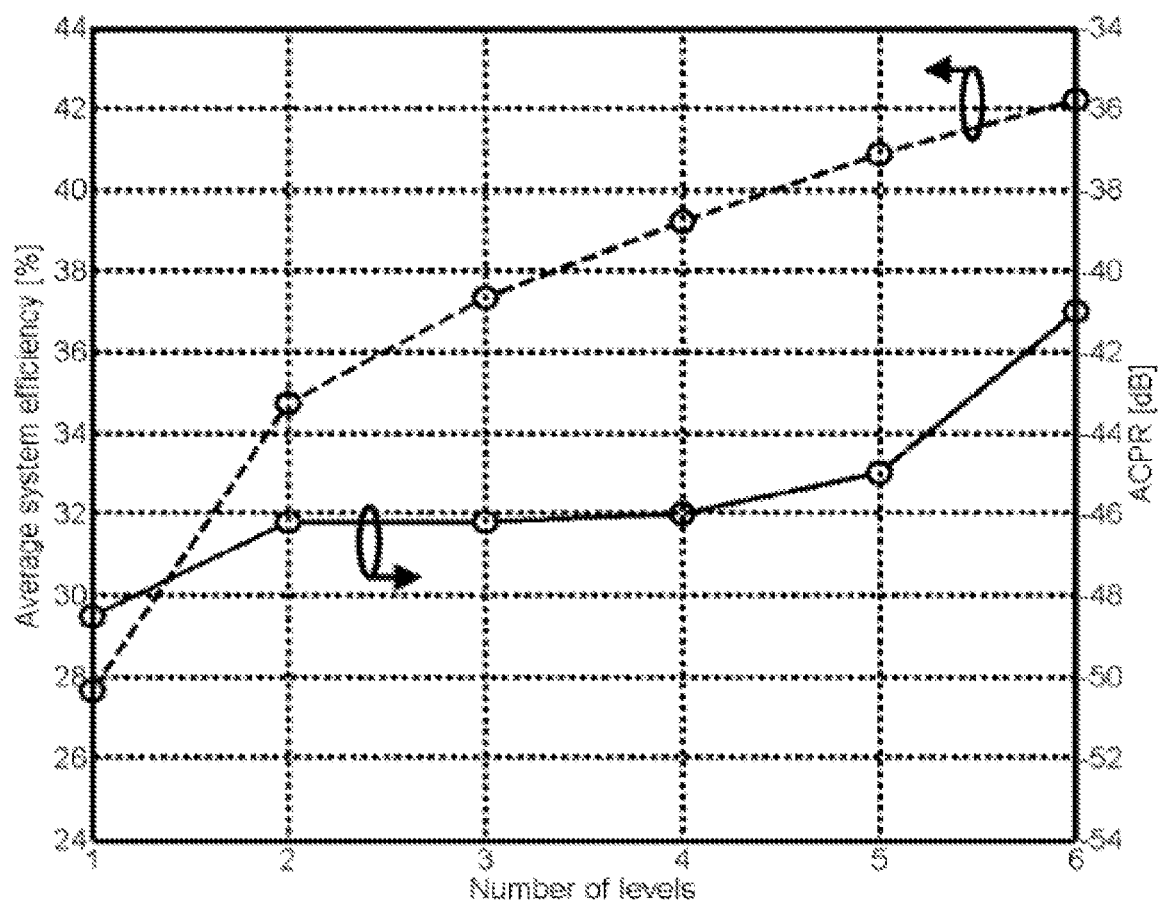
Figure 8:
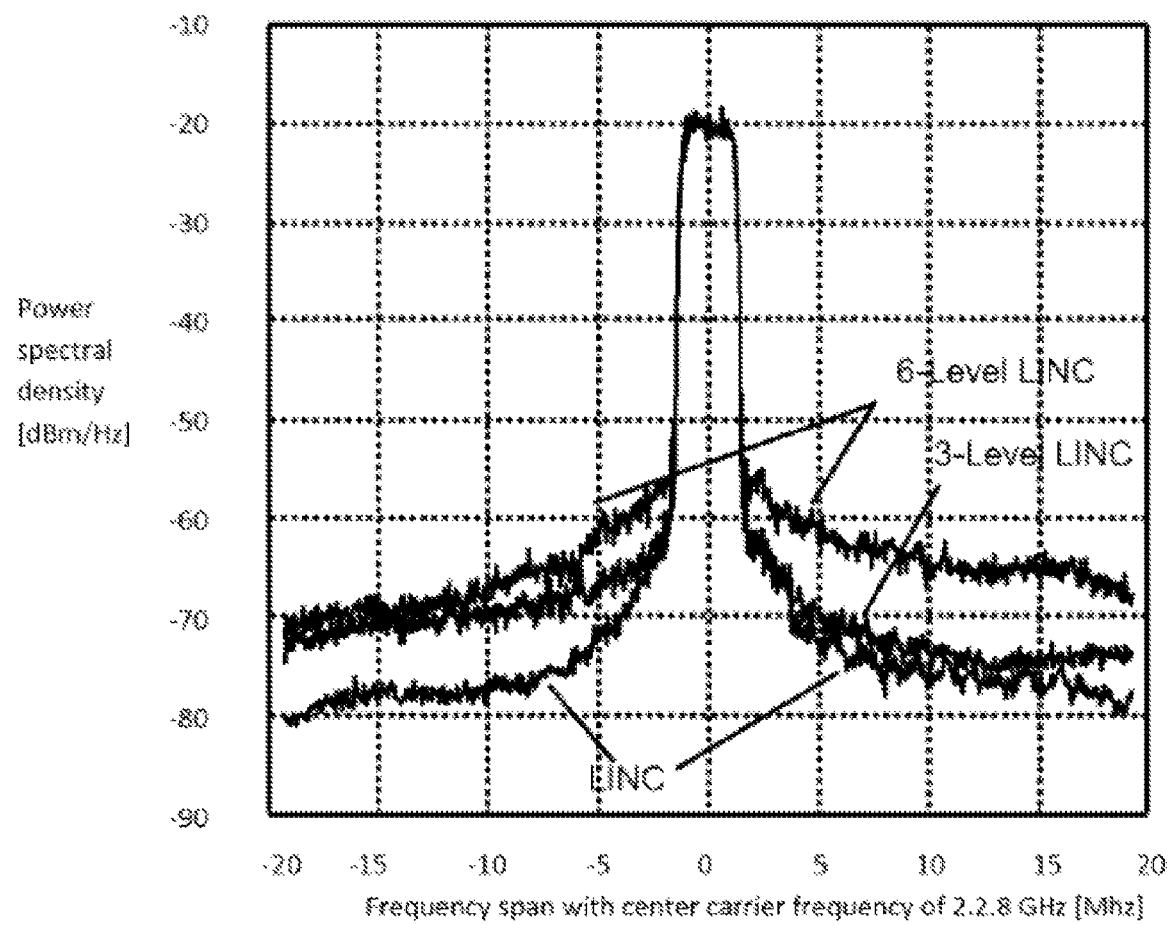
Figure 9:
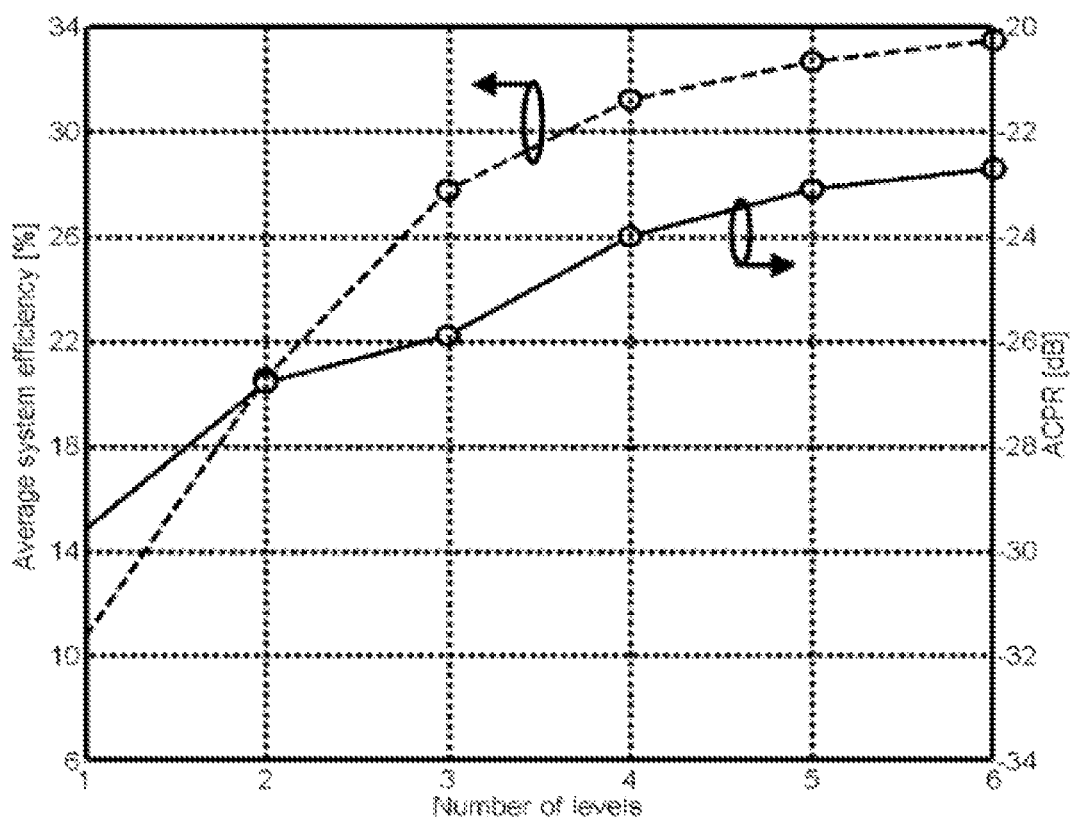
Figure 10:
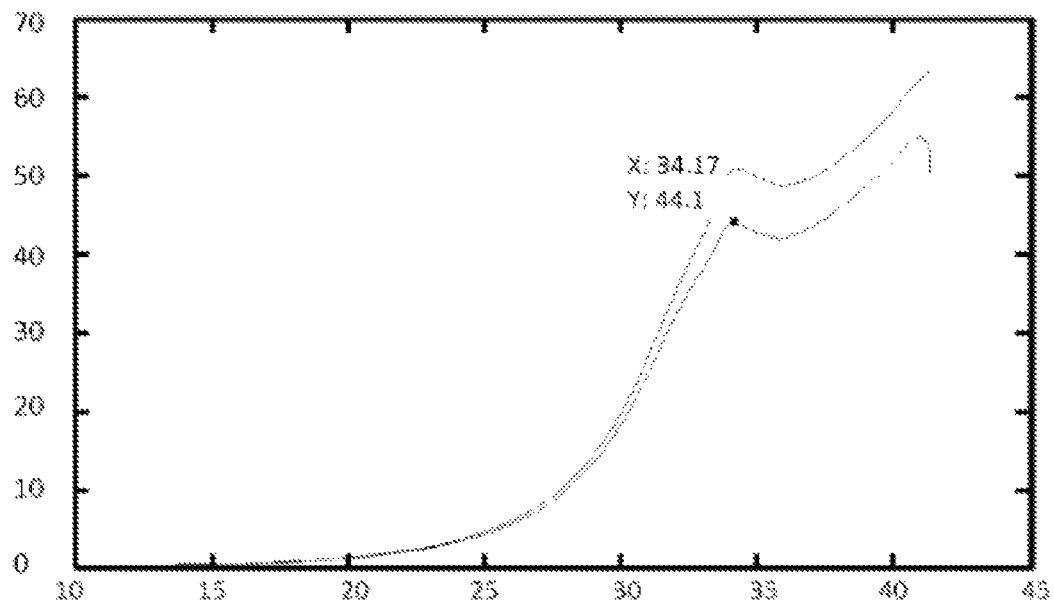
Figure 11:
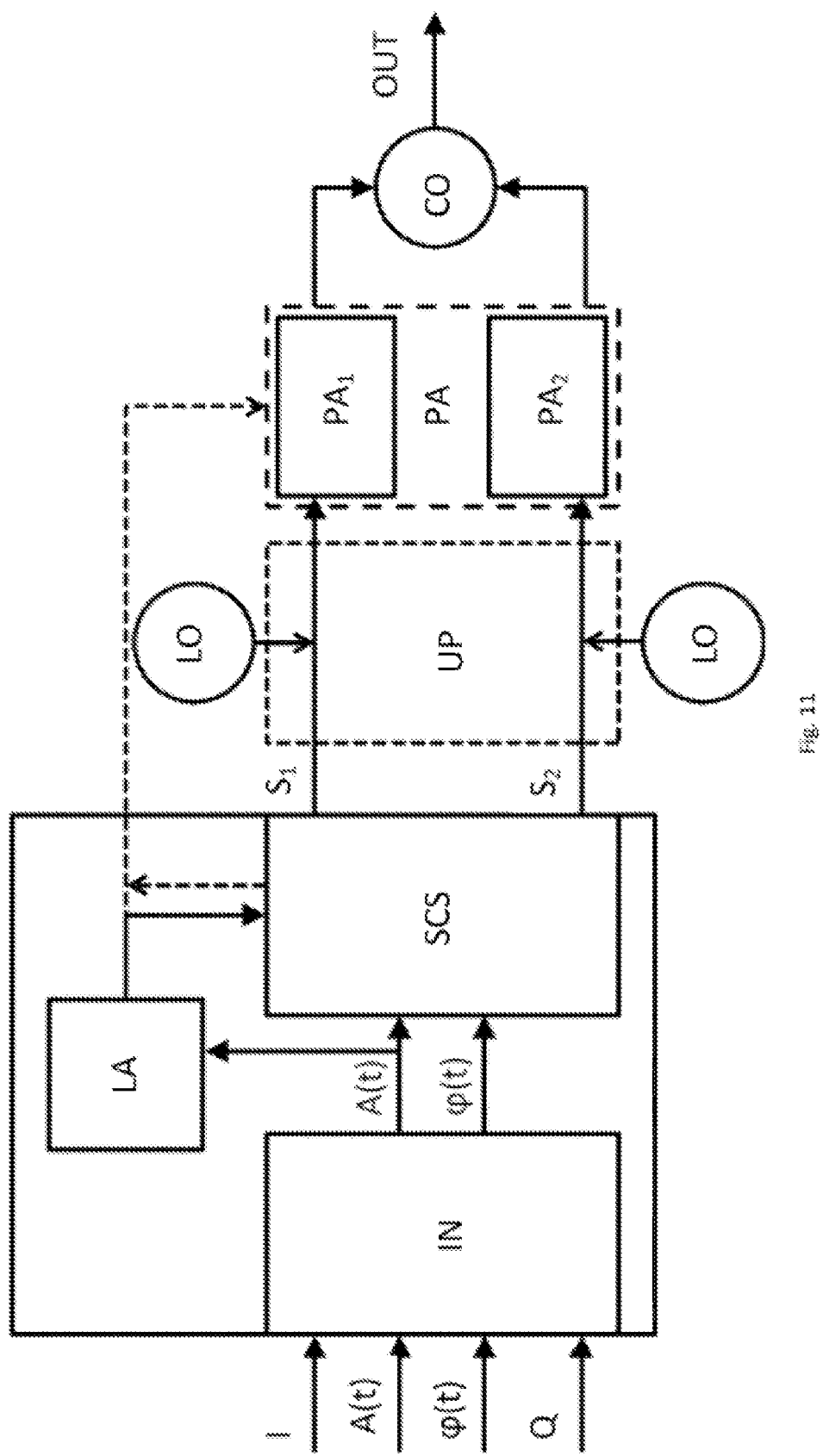

FIG. 6, one possible efficiency boost through the use of several levels in a multilevel LINC transmitter, FIG. 7, measurable adjacent-channel power and efficiency for a WCDMA signal as a function of the multilevel used, FIG. 8, a measurable output spectrum of a WCDMA signal in dependence on the number of levels used, FIG. 9, measurable adjacent-channel power and efficiency for a 20 MHz LTE signal as a function of the multilevel used, FIG. 10, measurable drain efficiency and efficiency of an exemplary Doherty amplifier, FIG. 11, a schematic diagram of an amplifier assembly according to embodiments of the invention.

The present amplifier assembly makes it possible to achieve an advantageous compromise between the required linearity and the attainable efficiency for the amplification of digitally modulated signals together with low system complexity. In the proposed amplifier assembly, the very good linearity properties of the LINC concept are combined with the high efficiency of Doherty amplifiers.

The use of Doherty amplifiers instead of switched amplifiers as the output stages yields substantial benefits on the system level, resulting in a distinct simplification of the overall system.

In addition, despite or precisely because of the low system complexity with these modifications, all critical system aspects, such as the temporal tuning of two different signal paths, can be dispensed with while the benefits of ML-LINC systems are retained.

An amplifier assembly according to the invention will now be shown with reference to FIG. 11. The assembly here shows an input device IN for receiving a representation of an input signal I, Q; A, phi. In this process, only I and Q need be obtained, for example. Then, from I and Q, one can create a corresponding amplitude signal A(t) and a phase signal phi(t) with the help of a quadrature to polar coordinate converter.

Furthermore, the amplifier assembly according to the invention has a signal component separator SCS, wherein the signal component separator SCS generates a first complex intermediate output signal $S_1$ and a second complex intermediate output signal $S_2$ on the basis of the input signal representation I, Q; A, phi.

In the figure, this is shown on the basis of the amplitude signal A(t) and the phase signal phi(t). However, the corresponding intermediate output signals can also be generated from the I and Q components by a corresponding signal processing.

The signal component separator provides a plurality of amplitude levels, wherein the plurality of amplitude levels is chosen so that a sum of the first complex intermediate output signal $S_1$ and the second complex intermediate signal $S_2$ is substantially a reflection of a complex input signal corresponding to the representation of the input signal I, Q; A, phi and the phase angle between the first complex intermediate output signal $S_1$ and the second complex intermediate output signal $S_2$ is small.

That is, a multilevel system is provided wherein the angle can be kept small thanks to the plurality of amplitude levels. This reduces power loss during subsequent combining and increases overall efficiency.

Furthermore, the amplifier assembly according to the invention has one or more amplifying devices PA, $PA_1$, $PA_2$ for amplification of the signals in the high-frequency layer. The amplifying device can be applied to each of the intermediate output signals in the high-frequency layer, as shown in FIG. 11, or the amplifying device can also be applied to the combined intermediate output signals in the high-frequency layer.

Moreover, the amplifier assembly according to the invention has a combining device CO for combining the signals.

In an especially preferred embodiment of the invention, the amplifying device is a Doherty arrangement.

The combining device CO is preferably an isolating combining device. Alternatively, the use of a non-isolating combining device CO is provided. This permits an increase in efficiency, although a certain loss of linearity must be factored in.

Without limiting the generality of the invention, the amplifying device can be a symmetrical or an asymmetrical Doherty amplifier assembly. In a symmetrical Doherty amplifier design, the (two) transistors used are comparably dimensioned, whereas in an asymmetrical Doherty amplifier assembly the (two) transistors used are dimensioned differently. As a rule, an efficiency plateau of around 6 dB can be obtained with a symmetrical Doherty amplifier assembly, while in an asymmetrical Doherty amplifier assembly an efficiency plateau of around 6 dB can be obtained. An asymmetrical Doherty amplifier assembly permits an improvement in efficiency or dynamic range.

Alternatively or additionally, the amplifying device can have one or more multipath or multilevel Doherty amplifiers.

In one embodiment of the invention, the amplifier assembly has a conversion device UP for generating upward-converted signals based on the first complex intermediate output signal $S_1$ and the second complex intermediate output signal $S_2$, with the conversion device UP being an upward mixer, and the upward-converted signals being taken to the amplifying device PA; $PA_1$, $PA_2$.

In an alternative embodiment of the invention, the amplifier assembly has a conversion device UP for generating upward-converted signals based on the first complex intermediate output signal $S_1$ and the second complex intermediate output signal $S_2$, with the conversion device UP having a phase modulator with an element with variable gain or variable attenuation.

In one embodiment of the invention, the signal component separator SCS furthermore provides a limiting of the maximum amplitude and or minimum amplitude of the first complex intermediate output signal $S_1$ and the second complex intermediate output signal $S_2$. In this way, distortions can be avoided and overall efficiency increased. In particular, limiting the minimum amplitude is important for linearity as well as for efficiency. By introducing a minimum amplitude, crossing of the zero line is prevented and the signal bandwidth is thereby reduced. Furthermore, the dynamic range is enlarged.

In one embodiment of the invention, the amplifier assembly furthermore provides a predistortion. A predistortion makes it possible to compensate for existing nonlinearities and thus maintain the desired linearity. This can increase efficiency, since in an uncompensated operation nonlinearity can typically be higher at a high level of efficiency than the transmission system allows.

In one embodiment of the invention, the signal component separator SCS furthermore provides a signal for control of the dynamic gain of the amplifying device PA; $PA_1$, $PA_2$. Since the signal component separator SCS can determine the target signal to be achieved in terms of its amplitude, the amplifying device PA; $PA_1$, $PA_2$ can also be effectively adjusted in this way. Thanks to the possibility of adjusting the amplifying device PA; $PA_1$, $PA_2$, the efficiency of the amplifying device PA; $PA_1$, $PA_2$ can also be kept in a favorable range with high linearity and efficiency, assuring high overall efficiency and high linearity of the overall amplifier assembly.

In one embodiment of the invention, the signal component separator SCS provides at least partly different amplitude levels for the first complex intermediate output signal $S_1$ and the second complex intermediate output signal $S_2$, which can enlarge the dynamic range.

Starting from the high linearity and the low efficiency of a conventional LINC system with isolating combiner, energy efficiency can be boosted at the cost of linearity by increasing the number of levels in multilevel LINC transmitters.

This is shown as an example in FIG. 7 for a 3.8 MHz WCDMA signal. The peak efficiency of the amplifiers used is 55%.

The measured "far-away noise" for the same signal is shown in FIG. 8 as a function of the number of optimized levels.

With the same arrangement, by adjusting the system parameters, other mobile radio standards can also be processed, i.e., the amplifier assembly is highly flexible and can therefore be used for a multiplicity of transmission systems. FIG. 9 shows measured adjacent-channel power and efficiency as a function of the number of levels optimized for the signal statistics of a 20 MHz LTE signal. Here as well, the peak efficiency of the amplifiers used is 55%.

In each of FIGS. 7 to 9, one must consider that these are not based on a phase-coherent upward mixing. The effects of this are especially noticeable as excessive adjacent-channel noise for broadband signals such as the 20 MHz LTE signal used for the measurements in FIG. 9. By using a phase-coherent frequency conversion even for a large number of selected levels the spectral emission mask of broadband signals is maintained.

Consequently, with the proposed design, a broadband flexible multistandard and multiband transmitter with high level of efficiency can be realized.

If one compares the efficiencies of the Doherty amplifiers in FIG. 10, the lower curve corresponds to the efficiency, i.e., the Power Added Efficiency, while the upper curve corresponds to the Drain Efficiency of the same amplifier. It will be seen that the obtained mean efficiencies as measured against the peak efficiency of the Doherty output stages of 55% are very high.

Thus, the invention enables the use of efficient Doherty amplifiers as output and/or driver stages in a multilevel LINC design.

In this way, a digital linearization of the entire transmission train is provided via a LINC structure.

Thanks to this approach, the advantages of both technologies can be preserved, without having to deal with the respective disadvantages. Thus, the proposed amplifier assembly provides the linearity of a traditional LINC or multilevel LINC transmitter coupled with the increased efficiency of symmetrical/asymmetrical Doherty amplifiers.

At the same time, system complexity can be reduced by the use of Doherty amplifiers, since the output power control can be adjusted continuously according to the principle of Doherty-based active load modulation.

An auxiliary amplifier, which can be part of the Doherty configuration, can modulate the output power of the overall design by means of the signal present at the input. A primary amplifier can be operated in voltage saturation mode over the largest possible dynamic range (6 dB for symmetrical designs, up to 12 dB and more for asymmetrical ones) and its load can be adapted such that the primary amplifier drives just enough current into the load for the required output power. Thus, a substantial efficiency boost is achieved.

When controlling the output power with such an active load modulation, the amplitude information together with the phase information goes directly to the inputs of the power amplifier. Thus, amplitude and phase signals travel the exactly identical path and no time delay occurs between the two signals. Programmable delay elements and special voltage supply modulators are thus not necessary, which in turn yields greater system bandwidth.

The system is simplified in the way shown in FIG. 11. Instead of the phase modulator, a traditional upward mixer UP can be used in this system for the frequency conversion of the amplitude- and phase-modulated signal. A limiting of the input signal amplitude by a clipper and a digital predistortion can be implemented in the digital range, in order to further improve system performance. This substantially simplifies the predistortion as compared to a transmitter with linear subassemblies throughout, since only the phase and amplitude response of the two pathways have to be equalized for a few discrete points. Between the selected points, the system is linearized by means of outphasing, i.e. via LINC.

In addition, the proposed amplifier assembly achieves a substantially higher efficiency for a comparable linearity, since the system can use Doherty amplifiers instead of switched amplifiers. Although Doherty amplifiers have a lower peak efficiency than saturated and switched amplifiers as are used in outphasing systems thus far, they have a much higher efficiency over a large dynamic range.

Through the use of asymmetrical Doherty designs and/or multipath Doherty amplifier designs, furthermore, increases in efficiency can also be achieved, since these amplifier designs have a high efficiency over a dynamic range of substantially more than 6 dB. In this way, the proposed amplifier assembly achieves high average efficiency levels for digitally modulated broadband signals with relatively low system complexity.

The proposed amplifier assembly enables a substantial reduction in system complexity as compared to traditional systems. The proposed amplifier assembly improves linearity and efficiency as compared to known systems, especially for broadband signals with a high crest factor. Furthermore, the proposed amplifier assembly enables a simple modification of the system for amplifying different transmission standards as well as a dynamic optimization of efficiency and linearity for the particular transmission standard being used. Moreover, the proposed amplifier assembly permits a simplified design of the Doherty amplifiers and enables an increased dynamic range, especially as compared to known LINC transmitters. In the proposed amplifier assembly, furthermore, there is a reduction in the sensitivity of the system to deviations (mismatches) of the amplitude and phase response between the two pathways. Thus, good savings in OPEX and CAPEX as well as a significant increase in efficiency relative to traditional systems are possible.

The proposed invention can be used in the most diverse equipment. For example, it is possible to use the invention in mobile phone base stations as well as mobile phone stations themselves, and in broadcast radio stations. In particular, the invention is suitable for use in Software Defined Radio applications.

The invention claimed is:

1. Amplifier assembly, wherein the assembly has:
   a. An input device for receiving a representation of an input signal (I, Q; A, phi),
   b. A signal component separator, wherein the signal component separator SCS generates a first complex intermediate output signal ($S_1$) and a second complex intermediate output signal ($S_2$), wherein the signal component separator SCS generates the first complex intermediate output signal ($S_1$) and the second complex intermediate output signal ($S_2$) on the basis of the representation of the input signal (I, Q; A, phi),
   c. Wherein the signal component separator provides a plurality of amplitude levels,
   d. Wherein the plurality of amplitude levels is chosen so that a sum of the first complex intermediate output signal ($S_1$) and the second complex intermediate signal ($S_2$) is substantially a reflection of a complex input signal corresponding to the representation of the input signal (I, Q; A, phi), and the phase angle between the first complex intermediate output signal ($S_1$) and the second complex intermediate output signal ($S_2$) is small,
   e. An amplifying device for amplification of the signals in the high-frequency layer, and
   f. A combining device for combining the signals.

2. The amplifier assembly according to claim 1, wherein the amplifying device is a Doherty design.

3. The amplifier assembly according to claim 1, wherein the combining device is an isolating combining device.

4. The amplifier assembly according to claim 1, wherein the combining device is a non-isolating combining device.

5. The amplifier assembly according to claim 1, wherein the amplifying device has an asymmetrical Doherty amplifier assembly.

6. The amplifier assembly according to claim 1, wherein the amplifying device has multipath Doherty amplifiers or multilevel Doherty amplifiers.

7. The amplifier assembly according to claim 1, wherein the amplifier assembly has a conversion device for generating upward-converted signals based on the first complex intermediate output signal ($S_1$) and the second complex intermediate output signal ($S_2$), with the conversion device having an upward mixer and the upward-converted signals being taken to the amplifying device.

8. The amplifier assembly according to claim 1, wherein the amplifier assembly has a conversion device for generating upward-converted signals based on the first complex intermediate output signal ($S_1$) and the second complex intermediate output signal ($S_2$), with the conversion device having a phase modulator with one element with variable gain or variable attenuation.

9. The amplifier assembly according to claim 1, wherein the signal component separator furthermore provides a limiting of the maximum amplitude and/or minimum amplitude of the first complex intermediate output signal ($S_1$) and the second complex intermediate output signal ($S_2$).

10. The amplifier assembly according to claim 1, wherein the amplifier assembly furthermore provides a predistortion.

11. The amplifier assembly according to claim 1, wherein the signal component separator furthermore provides a signal for control of the dynamic gain of the amplifying device.

12. The amplifier assembly according to claim 1, wherein the signal component separator provides at least partly different amplitude levels for the first complex intermediate output signal ($S_1$) and the second complex intermediate output signal ($S_2$).

13. Amplifier assembly, wherein the assembly has:
   a. An input device for receiving a representation of an input signal (I, Q; A, phi),
   b. A signal component separator, wherein the signal component separator SCS generates a first complex intermediate output signal ($S_1$) and a second complex intermediate output signal ($S_2$), wherein the signal component separator SCS generates the first complex intermediate output signal ($S_1$) and the second complex intermediate output signal ($S_2$) on the basis of the representation of the input signal (I, Q; A, phi),
   c. Wherein the signal component separator provides a plurality of amplitude levels,
   d. Wherein the plurality of amplitude levels is chosen so that a sum of the first complex intermediate output signal ($S_1$) and the second complex intermediate signal ($S_2$) is substantially a reflection of a complex input signal corresponding to the representation of the input signal (I, Q; A, phi), and the phase angle between the first complex intermediate output signal ($S_1$) and the second complex intermediate output signal ($S_2$) is small,
   e. An amplifying device for amplification of the signals in the high-frequency layer, and
   f. A combining device for combining the signals, further wherein:
      the amplifying device is a Doherty design that has multipath Doherty amplifiers or multilevel Doherty amplifiers, the amplifier assembly has a conversion device for generating upward-converted signals based on the first complex intermediate output signal ($S_1$) and the second complex intermediate output signal ($S_2$), with the conversion device having an upward mixer and the upward-converted signals being taken to the amplifying device, the amplifier assembly has a conversion device for generating upward-converted signals based on the first complex intermediate output signal ($S_1$) and the second complex intermediate output signal ($S_2$), with the conversion device having a phase modulator with one element with variable gain or variable attenuation, the signal component separator furthermore provides a limiting of the maximum amplitude and/or minimum amplitude of the first complex intermediate output signal ($S_1$) and the second complex intermediate output signal ($S_2$), the amplifier assembly furthermore provides a predistortion, the signal component separator furthermore provides a signal for control of the dynamic gain of the amplifying device, and the signal component separator provides at least partly different amplitude levels for the first complex intermediate output signal ($S_1$) and the second complex intermediate output signal ($S_2$).

* * * * *